United States Patent [19]

Mandl

[11] Patent Number: 5,550,764
[45] Date of Patent: Aug. 27, 1996

[54] IMAGE FILTERING WITH AN EFFICIENT IMPLEMENTATION OF HIGH ORDER DECIMATION DIGITAL FILTERS

[75] Inventor: Peter Mandl, Aurora, Canada

[73] Assignee: Genesis Microchip Inc., Ontario, Canada

[21] Appl. No.: 413,895

[22] Filed: Mar. 30, 1995

Related U.S. Application Data

[63] Continuation of Ser. No. 133,367, Oct. 8, 1993, abandoned.

[51] Int. Cl.$^6$ ........................................... G06F 17/10
[52] U.S. Cl. ........................................... 364/724.1
[58] Field of Search ........................... 364/724.1; 377/44

[56] References Cited

U.S. PATENT DOCUMENTS

| | | | |
|---|---|---|---|
| 4,852,035 | 7/1989 | Michener | 364/724.1 |
| 4,896,320 | 1/1990 | Göcklev | 364/724.1 |
| 4,972,356 | 11/1990 | Williams | 364/724.1 |
| 4,972,357 | 11/1990 | Morel | 364/724.1 |
| 5,054,088 | 10/1991 | Gunderson | 364/724.1 |
| 5,109,395 | 4/1992 | Tanaka | 377/44 |
| 5,157,395 | 10/1992 | Signore et al. | 364/724.1 |
| 5,181,033 | 1/1993 | Yassa et al. | 364/724.1 |
| 5,220,327 | 6/1993 | Abbiate et al. | 364/724.1 |
| 5,355,328 | 10/1994 | Arbeiter et al. | 364/724.1 |

OTHER PUBLICATIONS

Van der Kam, "A Digital Decimating Filter For Analog-to-Digital Conversion of Hi-Fi Signals," Philips Technical Review, vol. 42, No. 6/7, Apr., 1986, Eindhoven NL, pp. 230–238.

*Primary Examiner*—David H. Malzahn

[57] ABSTRACT

A decimator for effecting a X:1 decimation, where X=is any positive integer greater than 1, comprising a FIR filter for receiving and filtering an input stream of data bits and in response generating a like number of filtered output data bits; and a hold circuit for sampling and outputting every Xth one of the filtered output data bits.

4 Claims, 6 Drawing Sheets

IMAGE FILTERING WITH AN EFFICIENT IMPLEMENTATION OF HIGH ORDER DECIMATION DIGITAL FILTERS

This application is a continuation of application No. 08/133,367, filed Oct. 8, 1993, now abandoned.

FIELD OF THE INVENTION

This invention relates in general to the digital processing of images, and more particularly to a method of filtering an image with an effective hardware implementation of a high order decimating digital filter.

BACKGROUND OF THE INVENTION

Processing of images with multirate digital filters is well known in the art, as exemplified by U.S. Pat. No. 4,852,035 and U.S. patent application No. 07/766,128. For example, it is well known to filter, re-size, project and warp images (see Wolberg, G. "Digital Image Warping", IEEE Computer Society Press 1988; Lim, J. S., "Two Dimensional Signal and Image Processing", Prentice Hall 1990; and Rabiner, L. R. "Multirate Digital Signal Processing", Prentice Hall, 1983). The use of these and other prior art image processing techniques is characterized by hardware architectures not suitable for efficient integrated circuit (IC) implementation.

One implementation of a digital decimating filter is the traditional approach of using the classical tapped delay FIR filter to realize a high order filter. For example to implement a 129 tap digital filter requires 128 delay elements. For horizontal processing, the delay elements are pixel delays. For vertical processing, the IC real estate penalty is more severe since the delay elements are line stores.

SUMMARY OF THE INVENTION

The inventors have realized the desirability of implementing a high order filter using a lower order filter and discarding unwanted data. For example, according to the present invention it has been discovered that a 5-tap 2:1 decimating filter can be realized by using 3-tap filter and discarding 1 of 2 output samples. Likewise, a 9-tap 4:1 decimating filter can be realized by using a 3-tap filter and discarding 3 of 4 output samples. Since the lower order filter emulates the higher order filter by zeroing filter coefficients at the tail ends of the filter kernel, error is introduced into the output data samples. Thus, a tradeoff must be made balancing reduced hardware complexity, cost and IC real estate with introduction of image artifacts. However, the implementation of such a high order filter for image processing by using an approximation provided by a lower order filter has been found to result in negligible visual effects on image quality.

The present invention extends the decimating filter apparatus described in U.S. patent application Ser. No. 07/766, 128 to higher filter orders.

BRIEF DESCRIPTION OF THE DRAWINGS

A detailed description of the prior art and of the preferred embodiment of the present invention is provided herein below with reference to the following drawings, in which.

DETAILED DESCRIPTION OF THE PRIOR ART AND OF THE PREFERRED EMBODIMENT OF THE PRESENT INVENTION

Figure 1:
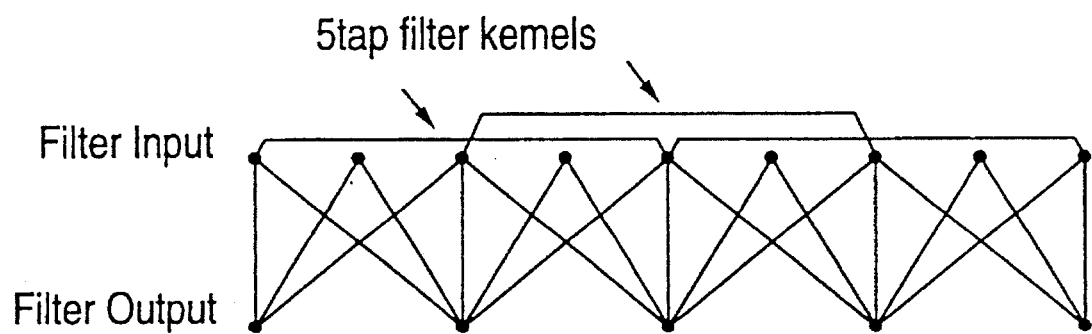
FIG. 1 shows a prior art 2:1 decimation of a pixel data stream with a 5-tap digital filter.

FIG. 1 illustrates schematically the prior art technique of implementing a 5-tap 2:1 decimating digital filter. Input pixels are weighted by the coefficients of the 5-tap filter to produce one filtered pixel for every two input pixels.

Figure 2:
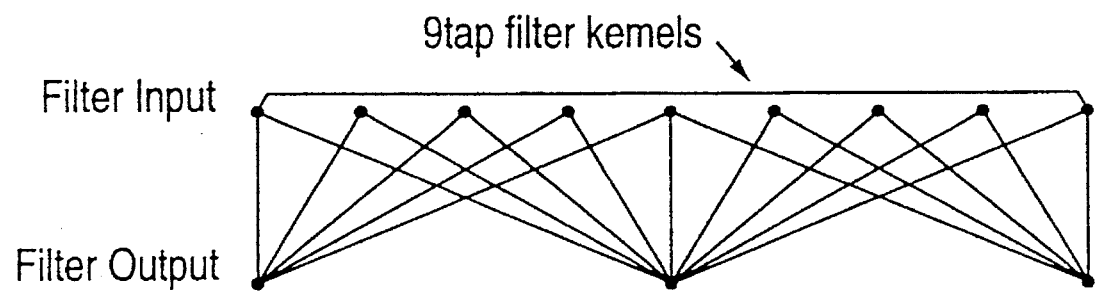
FIG. 2 shows a prior art 4:1 decimation of a pixel data stream with a 9-tap digital filter.

FIG. 2 illustrates schematically the prior art technique of implementing a 9-tap 4:1 decimating digital filter. Input pixels are weighted by the coefficients of the 9-tap filter to produce one filtered pixel for every four input pixels.

It is known that decimation can be effected by a filter of any order suitable to the application for which the filter is to be used. The choice of filter order determines the "quality" of the filter.

Figure 3A:
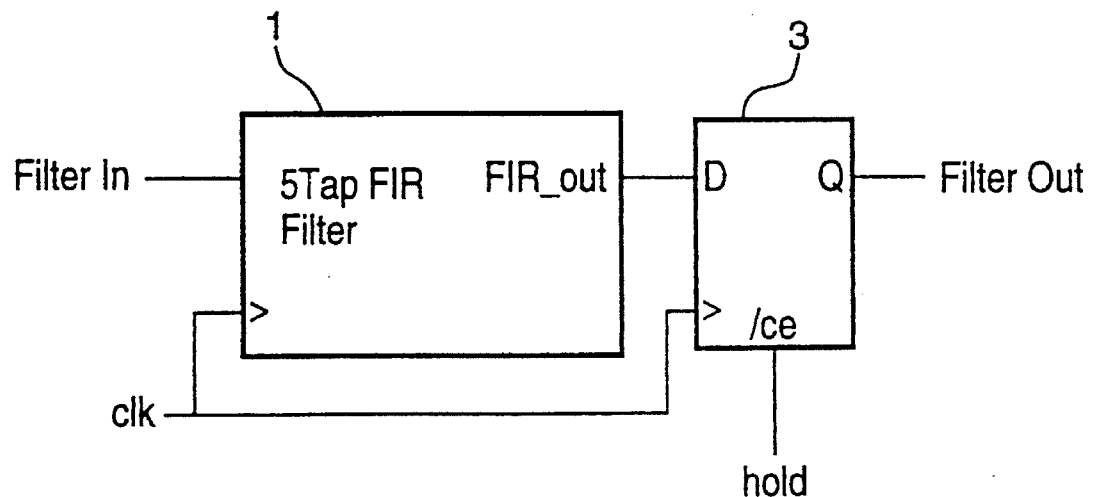
FIG. 3A is a block diagram of the elements of a 2:1 decimator using a 5-tap digital filter, according to the prior art.
Figure 3B:
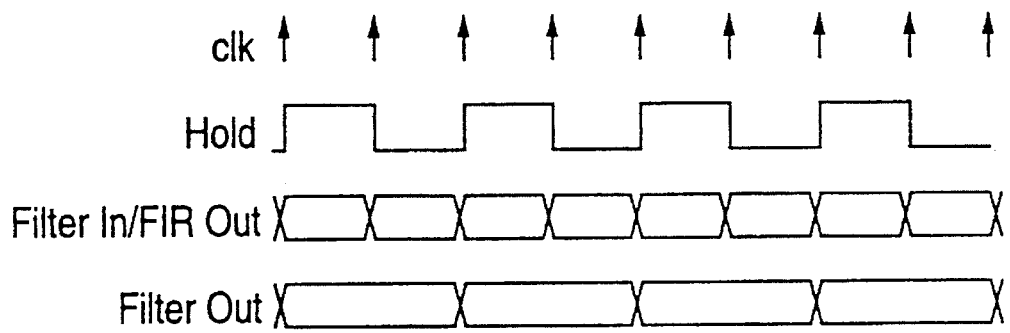
FIG. 3B is a timing diagram for operation of the elements shown in FIG. 3A.

A block diagram of the circuit elements required to implement the prior art technique is shown in FIG. 3A, and the timing diagram for operating the elements is shown in FIG. 3B. A classical tapped delay line digital FIR filter 1 is connected to a storage register 3 which retains 1 of 2, 1 of 4, etc. filtered output pixels from filter 1 for a 2:1, 4:1 etc. decimation response. Communications theory establishes that as the decimation of the sample rate increases (i.e. 2:1, 4:1, 8:1 etc), the pass band of the digital filter decreases in inverse proportion. This indicates a requirement to use a higher order filter as the decimation factor increases. Higher order filters necessarily require more delay elements, which for vertical image processing imposes significant IC real estate penalties due to line store requirements.

The present invention provides a means of effectively implementing higher order decimating digital filters. The principle involves using a lower order filter to approximate the coefficients nearest the centre tap of the higher order filter and zeroing the remaining coefficients and some output data samples. An error is introduced using this method and a tradeoff therefore exists between filter order (i.e. complexity/IC real estate) and the resulting image artifacts. However, it has been found that by optimizing the hardware design, a filter can be created which is characterized by negligible visual effects on image quality.

Figure 4:
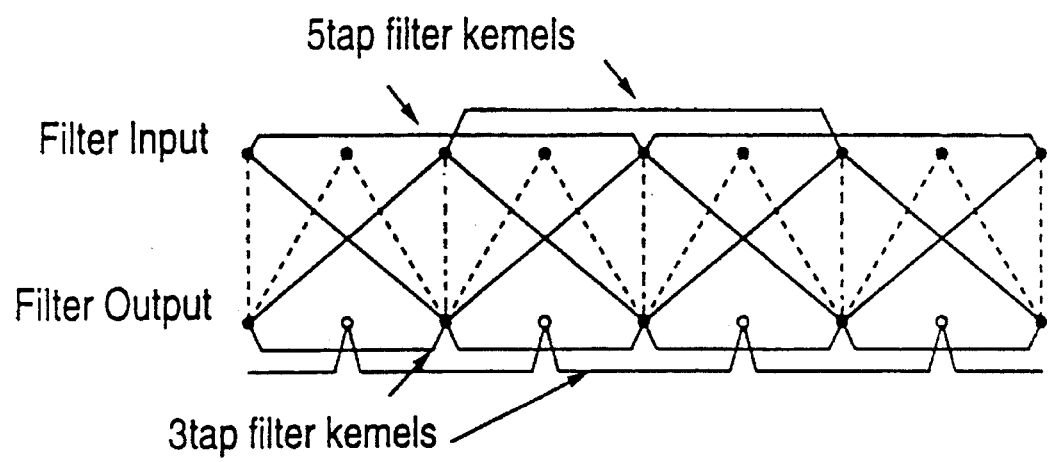
FIG. 4 shows a 2:1 decimation of a pixel data stream with a 3-tap filter according to the principles of the present invention.

FIG. 4 illustrates a 5-tap 2:1 decimator realized with a 3-tap filter according to the principles of the present invention. The dotted and dashed lines indicate the filter taps associated with the 3-tap filter. The dashed and solid lines indicate filter taps associated with the 5-tap or 9-tap filters. Valid output pixels are represented by solid dots, and zeroed pixels are represented by empty dots.

Figure 5:
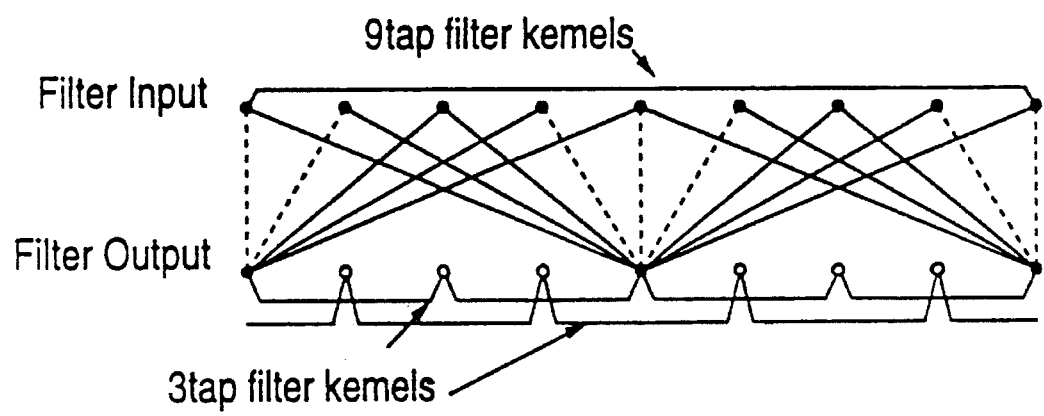
FIG. 5 shows a 4:1 decimation of a pixel data stream with a 3-tap filter according to the principles of the present invention.

FIG. 5 illustrates a 9-tap 4:1 decimator realized with a 3-tap filter, according to the principles of the present invention.

Figure 6A:
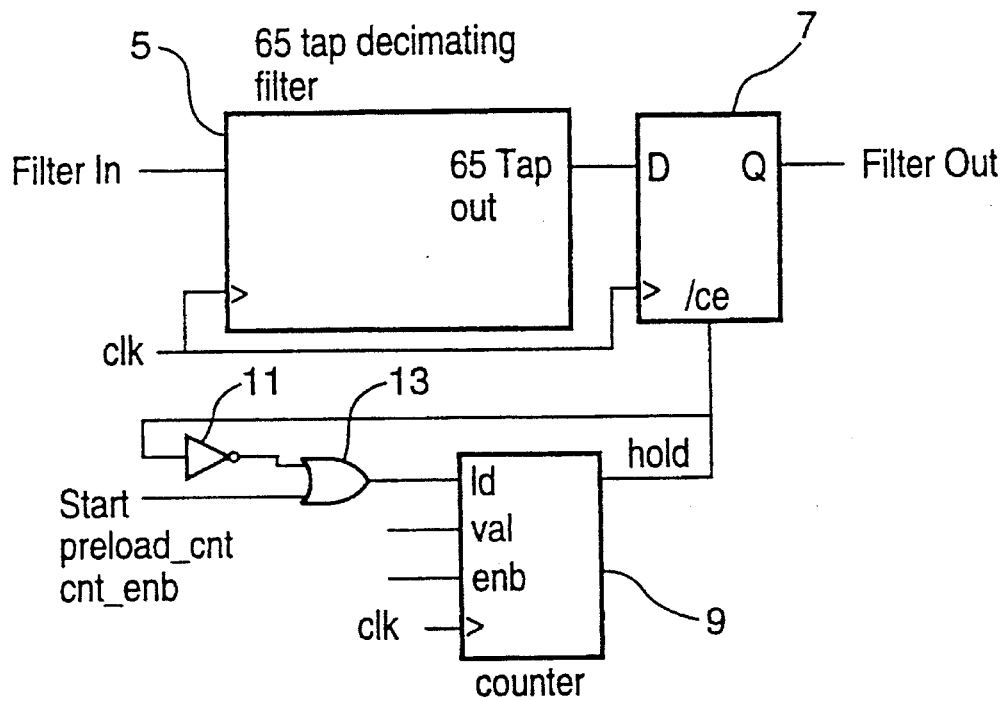
FIG. 6A is a block diagram of a decimating filter according to the preferred embodiment of the present invention.

FIG. 6A is a block diagram of the preferred embodiment of the decimating filter of the present invention. As discussed above, the present invention extends the decimating filter apparatus described in U.S. patent application Ser. No. 07/766,128 to higher filter orders. Specifically, the 65 tap filter 1 is extended to emulate filter orders of 129, 257, 513, 1025 and 2049 taps.

The 65 tap decimating filter 5 generates filtered output pixels which are held by storage register 7. Counter 9 is loaded with a preload count value (preload_cnt) and controls which pixels output from filter 5 are held in register 7. Table 1 below, illustrates the preload count value and associated filter order along with the decimation factor applied to the input data.

TABLE 1

| Preload-cnt | Filter Order | Decimation |
|---|---|---|
| 2 | 129 | 64:1 |
| 4 | 257 | 128:1 |
| 8 | 513 | 256:1 |
| 16 | 1025 | 512:1 |
| 32 | 2049 | 1024:1 |

The hold signal (hold) generated by the counter 9 is also applied to inverter 11 and OR gate 13 to repeatedly re-load counter 9 after the terminal count of 1 is reached. The start signal (start) applied to OR gate 13 is used to synchronize counter 9 to ensure that the hold signal applied to storage register 7 outputs filtered pixels that correspond to the center tap position of the higher order filter. The counter enable signal (cnt_enb) advances the counter only when the 65 tap decimating filter 5 outputs a filtered pixel.

Figure 6B:
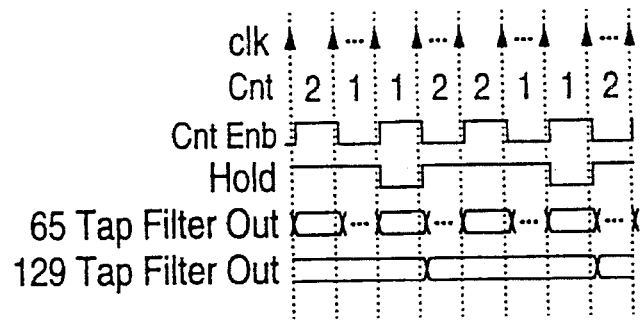
FIG. 6B illustrates the timing for the elements shown in the block diagram of FIG. 6A when configured for a 129 tap filter and 64:1 decimation.

FIG. 6B illustrates the timing for the elements shown in the block diagram of 6A when configured for a 129 tap filter and 64:1 decimation.

Figure 6C:
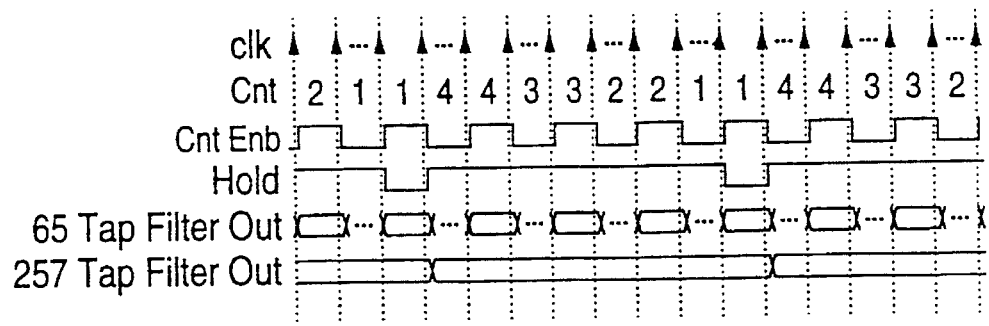
FIG. 6C illustrates the timing for the elements shown in the block diagram of FIG. 6A when configured for a 257 tap filter and 128:1 decimation.

FIG. 6C illustrates the timing for the elements shown in the block diagram of 6A when configured for a 257 tap filter and 128:1 decimation.

Figure 7A:
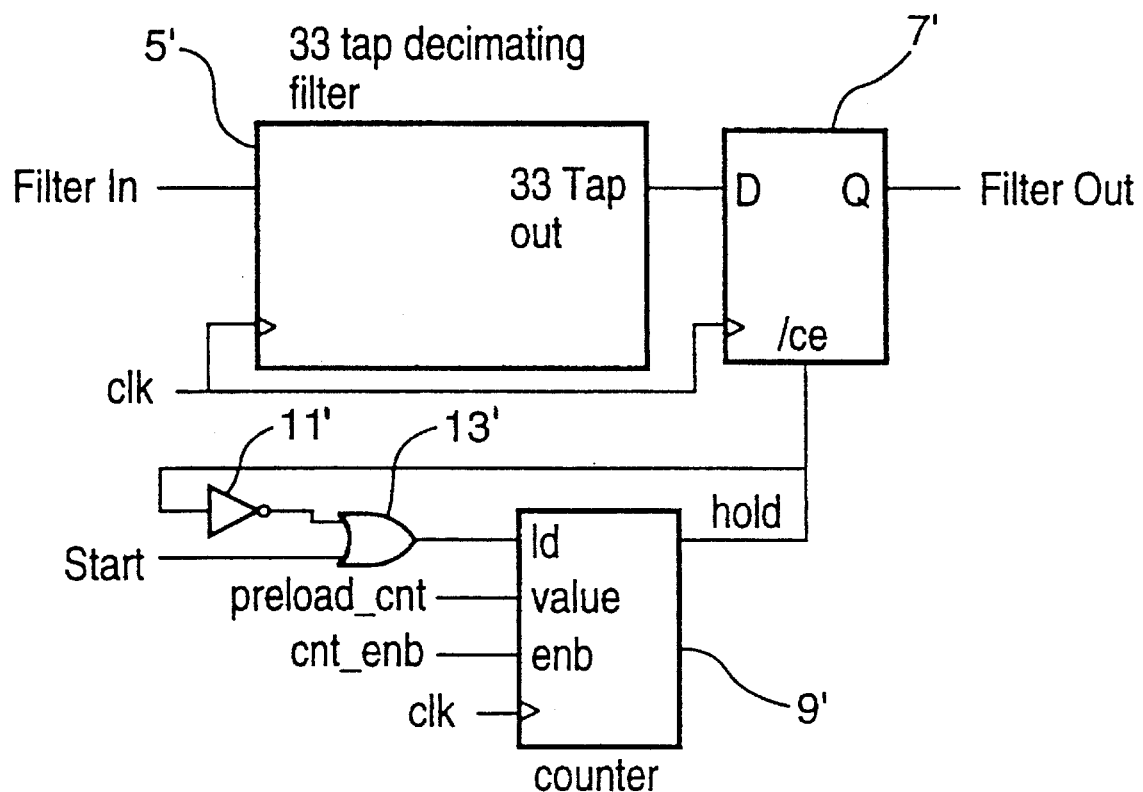
FIG. 7A illustrates a block diagram of an alternative embodiment of the present invention.

FIG. 7A illustrates a block diagram of a variation of the preferred embodiment of the present invention. In FIG. 7A, filter 5' is a 33 tap decimating filter. Table 2, below, illustrates the preload count value and associated filter order along with the decimation factor applied to the input data.

TABLE 2

| Preload Cnt | Filter Order | Decimation |
|---|---|---|
| 2 | 65 | 64:1 |
| 4 | 129 | 128:1 |
| 8 | 257 | 256:1 |
| 16 | 513 | 512:1 |
| 32 | 1025 | 1024:1 |

Figure 7B:
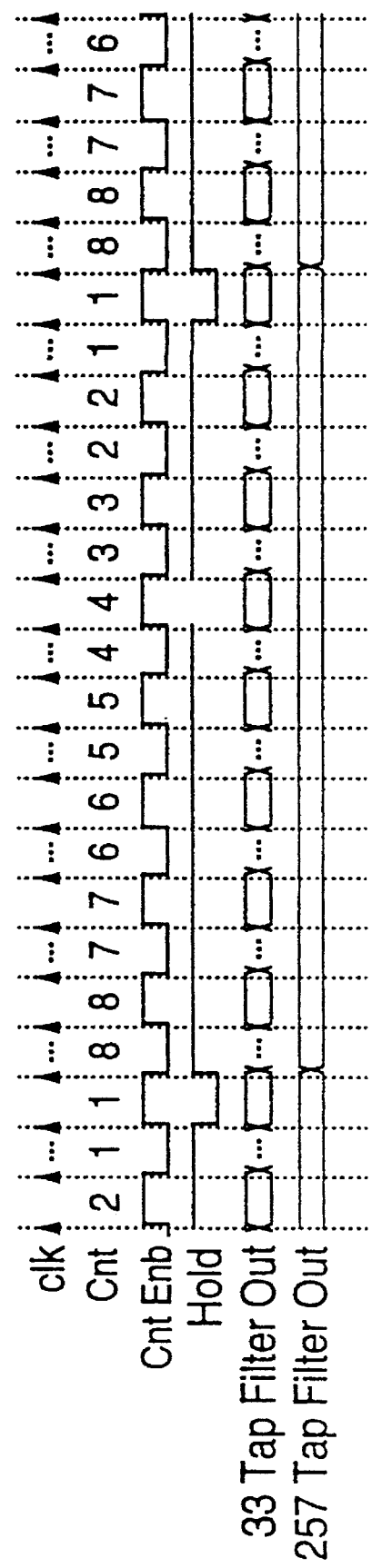
FIG. 7B illustrates the timing for the elements shown in the block diagram of FIG. 7A when configured for a 257 tap filter and 256:1 decimation.

As Table 2 shows, the elements of FIG. 7A are used to emulate filters with 65, 129, 257, 513 and 1025 taps. The elements of FIG. 7A operate in a similar manner as those of FIG. 6A except that filter 5' is a 33 tap decimating filter FIG. 7B illustrates the timing for the elements shown in the block diagram of FIG. 7A when configured for a 257 tap filter and 256:1 decimation.

Other embodiments and modifications of the invention are possible. For example, although the preferred embodiment is implemented using a 65 or 33-tap filter, any order of filter may be utilized for implementing any desired degree of decimation (eg. 64:1, 128:1, etc.), provided that the decimation ratio and filter order are compatible. All such variations and modifications are possible within the sphere and scope of the invention as defined by the claims appended hereto.

I claim:

1. A decimator for effecting a X:1 decimation of a digital image signal, where X is a selectable positive integer greater than 1, comprising:

a) means for generating a clock signal;

b) a single FIR filter characterized by a fixed frequency response, and having a data input for receiving an input stream of unfiltered image data bits, a clock input for receiving said clock signal, and an output for generating an output stream of filtered output image data bits;

c) a counter having a pre-load input for receiving a selectable count value equal to X, a clock input for receiving said clock signal, and an output for generating a hold signal once every X cycles of said clock signal; and d) a storage register having a data input connected to the output of said FIR filter, a clock input for receiving said clock signal, a control input for receiving said hold signal and an output for outputting every Xth one of said filtered output image data bits, thereby implementing said X:1 decimation of said digital image signal for said selectable positive integer X utilizing said only single FIR filter.

2. A digital image signal decimator, comprising:

a) a single FIR filter characterized by a fixed frequency response for implementing a decimation of X:1, where X is any positive integer, said FIR filter having a data input for receiving an input stream of unfiltered image data bits and an output image for generating successive samples of filtered output data bits according to said decimation of X:1;

b) a counter having a pre-load input for receiving a selectable count value equal to Y, where Y is any positive integer, and an output for generating a hold signal once every Y of said samples; and c) a storage register having a data input connected to the output of said FIR filter, a control input for receiving said hold signal and an output for outputting every Yth one of said samples of filtered output image data bits; thereby producing a decimation of (Y * X):1 for said selectable value Y utilizing said single FIR filter.

3. The decimator of claim 2, wherein said single FIR is a 65-Tap filter for implementing a decimation of 32:1, said count value is equal to 2 for effecting said decimation (Y * X):1 of 64:1 with an emulated filter order of 129-Taps, said count value Y is equal to 4 for effecting said decimation (Y * X):1 of 128:1 with an emulated filter order of 257-Taps, said count value Y is equal to 8 for effecting said decimation (Y * X):1 of 256:1 with an emulated filter order of 513-Taps, said count value Y is equal to 16 for effecting said decimation (Y * X):1 of 512:1 with an emulated filter order of 1025-Taps, and said count value Y is equal to 32 for effecting said decimation (Y * X):1 of 1024:1 with an emulated filter order of 2049-Taps.

4. The decimator of claim 2, wherein said single FIR is a 33-Tap filter for implementing said decimation X:1 of 32:1, said count value Y is equal to 2 for effecting said decimation (Y * X):1 of 64:1 with an emulated filter order of 65-Taps, said count value Y is equal to 4 for effecting said decimation (Y * X):1 of 128:1 with an emulated filter order of 129-Taps, said count value Y is equal to 8 for effecting said decimation (Y * X):1 of 256:1 with an emulated filter order of 257-Taps, said count value Y is equal to 16 for effecting said decimation (Y * X):1 of 512:1 with an emulated filter order of 513-Taps, and said count value Y is equal to 32 for effecting said decimation (Y * X):1 of 1024:1 with an emulated filter order of 1025-Taps.

* * * * *